United States Patent
Hsieh

(10) Patent No.: US 8,381,994 B2
(45) Date of Patent: Feb. 26, 2013

(54) DATA STORAGE DEVICE, STACKING METHOD THEREOF, AND DATA STORAGE DEVICE ASSEMBLY

(75) Inventor: Cheng-Chieh Hsieh, Hsinchu (TW)

(73) Assignee: Phison Electronics Corp., Miaoli (TW)

( * ) Notice: Subject to any disclaimer, the term of this patent is extended or adjusted under 35 U.S.C. 154(b) by 222 days.

(21) Appl. No.: 13/025,172

(22) Filed: Feb. 11, 2011

(65) Prior Publication Data

US 2012/0145796 A1    Jun. 14, 2012

(30) Foreign Application Priority Data

Dec. 13, 2010   (TW) ............................... 99143518 A

(51) Int. Cl.
*G06K 19/06*    (2006.01)
(52) U.S. Cl. ............ 235/492; 235/451; 235/487; 29/604
(58) Field of Classification Search .................. 235/492, 235/382, 451, 487, 380; 29/604
See application file for complete search history.

(56) References Cited

U.S. PATENT DOCUMENTS 7,762,470 B2 *   7/2010   Finn et al. ..................... 235/492

* cited by examiner

*Primary Examiner* — Edwyn Labaze
(74) *Attorney, Agent, or Firm* — Jianq Chyun IP Office

(57) ABSTRACT

A data storage device, a stacking method thereof, and a data storage device assembly are provided. The data storage device assembly includes a first data storage device and a second data storage device respectively having a body, a magnetic element, and a storage device. Each body has a first containing space and a second containing space. Each magnetic element is disposed in the corresponding first containing space. At least one of the magnetic elements of the first and the second data storage device is a magnet. Each storage device is disposed in the corresponding second containing space and includes an electrical connector terminal, a memory chip, and a memory controller with no crystal oscillator. The magnetic elements of the first and the second data storage device attract each other so that the body of the first data storage device is stacked on the body of the second data storage device.

20 Claims, 8 Drawing Sheets

DATA STORAGE DEVICE, STACKING METHOD THEREOF, AND DATA STORAGE DEVICE ASSEMBLY

CROSS-REFERENCE TO RELATED APPLICATION

This application claims the priority benefit of Taiwan application serial no. 99143518, filed on Dec. 13, 2010. The entirety of the above-mentioned patent application is hereby incorporated by reference herein and made a part of this specification.

BACKGROUND

1. Technology Field

The present invention generally relates to a data storage device, and more particularly, to a data storage device that can be easily stacked, a stacking method thereof, and a data storage device assembly.

2. Description of Related Art

Along with the development of technologies, high portability has become one of the most important features of today's storage media along with large storage capacity. Accordingly, highly portable flash drive has become one of today's most indispensable digital products. A flash drive has a flash memory as its storage component, and a flash memory is a non-volatile memory (data stored therein won't be lost when power is turned off) and offers such advantages as being programmable and erasable, high access speed, and low power consumption. Thus, conventional 3.5" floppy disk and CD that have either small storage capacity or inconvenient data update performance are gradually replaced by flash drive that comes with plug-and-play and hot plug features.

Generally speaking, a host system can write data into or read data from a flash drive conveniently as long as the host system comes with a transmission interface compatible to the flash drive. Accordingly, the portability of data is greatly improved. Thus, nowadays, people are getting used to storing data in flash drives, and one usually has more than one flash drive products. However, since flash drive products are usually very small, how to effectively keep and manage several flash drive products has become one of the major subjects to today's flash drive manufacturers.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a data storage device, wherein the data storage device can be stacked with other data storage devices and easily accessed.

The present invention is also directed to a data storage device assembly, wherein the data storage device assembly includes a plurality of data storage devices that are stacked together and can be easily accessed.

The present invention is further directed to a method for stacking a plurality of data storage devices together, wherein the stacked data storage devices can be easily accessed.

The present invention provides a data storage device including a body, a magnetic element, and a storage device. The body has a first containing space and a second containing space. The magnetic element is disposed in the first containing space. The storage device is disposed in the second containing space. The storage device includes an electrical connector terminal, a memory chip, and a memory controller. The memory controller is coupled to the electrical connector terminal and the memory chip and the memory controller has no crystal oscillator.

The present invention also provides a data storage device assembly including a first data storage device and a second data storage device. The first data storage device and the second data storage device respectively include a body, a magnetic element, and a storage device. Each body has a first containing space and a second containing space. Each magnetic element is disposed in the first containing space. At least one of the magnetic elements of the first data storage device and the second data storage device is a magnet. Each storage device is disposed in the second containing space and includes an electrical connector terminal, a memory chip, and a memory controller, wherein the memory controller is coupled to the electrical connector terminal and the memory chip and the memory controller has no crystal oscillator. The magnetic element of the first data storage device and the magnetic element of the second data storage device attract each other so that the body of the first data storage device is stacked on the body of the second data storage device.

The present invention further provides a method for stacking a first data storage device and a second data storage device. The first data storage device and the second data storage device respectively include a body and a storage device. Each body has a first containing space and a second containing space. Each storage device is disposed in the second containing space and includes an electrical connector terminal, a memory chip, and a memory controller, wherein the memory controller is coupled to the electrical connector terminal and the memory chip and the memory controller has no crystal oscillator. The method includes respectively disposing magnetic elements in the first containing space of the body of the first data storage device and in the first containing space of the body of the second data storage device, wherein at least one of the magnetic elements of the first data storage device and the second data storage device is a magnet. The method also includes making the magnetic element of the first data storage device and the magnetic element of the second data storage device to attract each other so as to stack the body of the first data storage device on the body of the second data storage device.

As described above, in the present invention, a magnetic element is disposed on the body of a data storage device so that several data storage devices can be stacked together through magnetic force to form a data storage device assembly. Thereby, a user can manage several data storage devices conveniently, and since the magnetic force is not that strong, the user can easily access any one of the data storage devices. Moreover, a user can attach a data storage device on any panel that is attractable to a magnet. The possibility of losing any one of the data storage device is reduced by stacking several data storage devices together, and the data storage devices can be used for paper clipping.

It should be understood, however, that this Summary may not contain all of the aspects and embodiments of the present invention, is not meant to be limiting or restrictive in any manner, and that the present invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the present invention, and are incor

DESCRIPTION OF THE EMBODIMENTS

Figure 1:
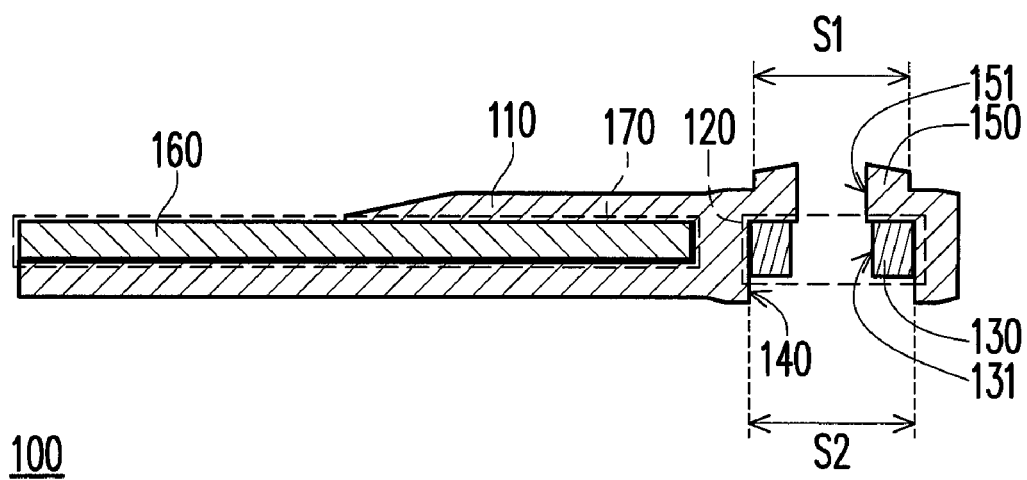
- FIG. 1 is a cross-sectional view of a data storage device according to an exemplary embodiment of the present invention.

Reference will now be made in detail to the present preferred embodiments of the present invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
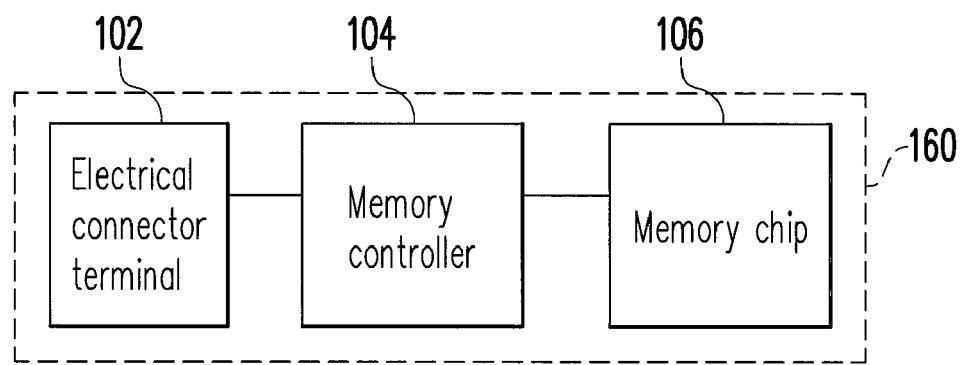
FIG. 2 is a block diagram of a storage device according to an exemplary embodiment of the present invention.
Figure 3:
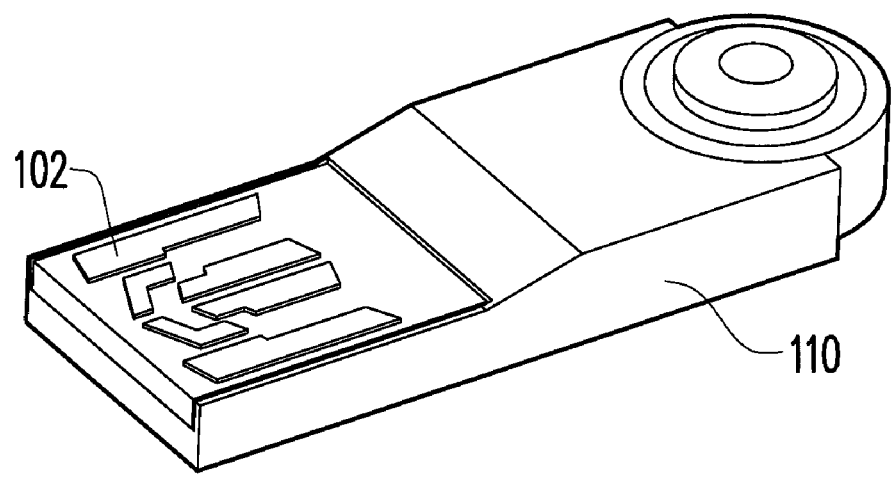
FIG. 3 is a diagram illustrating the appearance of a data storage device according to an exemplary embodiment of the present invention.

FIGS. 1-3 are diagrams of a data storage device according to an exemplary embodiment of the present invention. The data storage device in the present exemplary embodiment may be a flash drive. However, the present invention is not limited thereto.

Referring to FIG. 1, the data storage device 100 includes a body 110, a magnetic element 130, and a storage device 160. The body 110 has a first containing space 120 and a second containing space 170. The magnetic element 130 is disposed in the first containing space 120, and the storage device 160 is disposed in the second containing space 170.

The magnetic element 130 may be a magnet, an iron material, a nickel material, or any paramagnetic material which can be attracted by the magnet.

Referring to FIG. 2, the storage device 160 includes an electrical connector terminal 102, a memory controller 104, and a memory chip 106. The memory controller 104 is coupled to the electrical connector terminal 102 and the memory chip 106.

The electrical connector terminal 102 is configured for coupling to a host system. In the present exemplary embodiment, the electrical connector terminal 102 is a metal conductive slice laid on and exposed by the surface of the storage device 160 (as shown in FIG. 3). However, in other exemplary embodiments, the electrical connector terminal 102 may also comply with the universal serial bus (USB) interface standard, the peripheral component interconnect (PCI) express interface standard, the Institute of Electrical and Electronic Engineers (IEEE) 1394 interface standard, the secure digital (SD) interface standard, the memory stick (MS) interface standard, the multimedia card (MMC) interface standard, the serial advanced technology attachment (SATA) interface standard, the compact flash (CF) interface standard, the integrated drive electronics (IDE) interface standard, the parallel advanced technology attachment (PATA) interface standard, or any other suitable interface standard.

The memory controller 104 executes a plurality of logic gates or control instructions implemented in a hardware or firmware form and performs various data operations on the memory chip 106 according to instructions from the host system. In the present exemplary embodiment, the memory controller 104 has no crystal oscillator so that the operation thereof is not affected by the magnetic element 130.

The memory chip 106 is configured for storing file system information and other general data, such as text, video, and audio files. The memory chip 106 may be a rewritable non-volatile memory. For example, the memory chip 106 may be a multi level cell (MLC) NAND flash memory chip, a single level cell (SLC) NAND flash memory chip, or any other type of flash memory chip.

As shown in FIG. 1, in the present exemplary embodiment, the body 110 of the data storage device 100 further has a first opening 140 and a protruding part 150. The first opening 140 and the protruding part 150 are respectively located at two opposite sides of the first containing space 120, and the first opening 140 and the first containing space 120 are connected with each other. To be specific, the protruding part 150 has a second opening 151, the magnetic element 130 has a through hole 131, and the first opening 140, the through hole 131, and the second opening 151 are connected with each other.

In the present exemplary embodiment, the size of the protruding part 150 substantially matches the size of the first opening 140. Thus, if the protruding part 150 and the first opening 140 are both in a circular shape, the external diameter S1 of the protruding part 150 substantially matches the internal diameter S2 of the first opening 140. However, the shape of the protruding part 150 and the first opening 140 is not limited in the present invention, and the protruding part 150 and the first opening 140 may also be both in a rectangular or any other shape.

If the magnetic element 130 is a magnet, a user can attach the data storage device 100 on any surface attractable to the magnet through the magnetic element 130 disposed in the first containing space 120, so as to prevent the small-sized data storage device 100 from being lost. Besides, the data storage device 100 disposed with the magnetic element 130 can be used as a memo clip, and the user can clip a piece of paper or any other thin material on a surface attractable to the magnet by using the data storage device 100. Thereby, the data storage device 100 is made a tool of multiple purposes.

Figure 4:
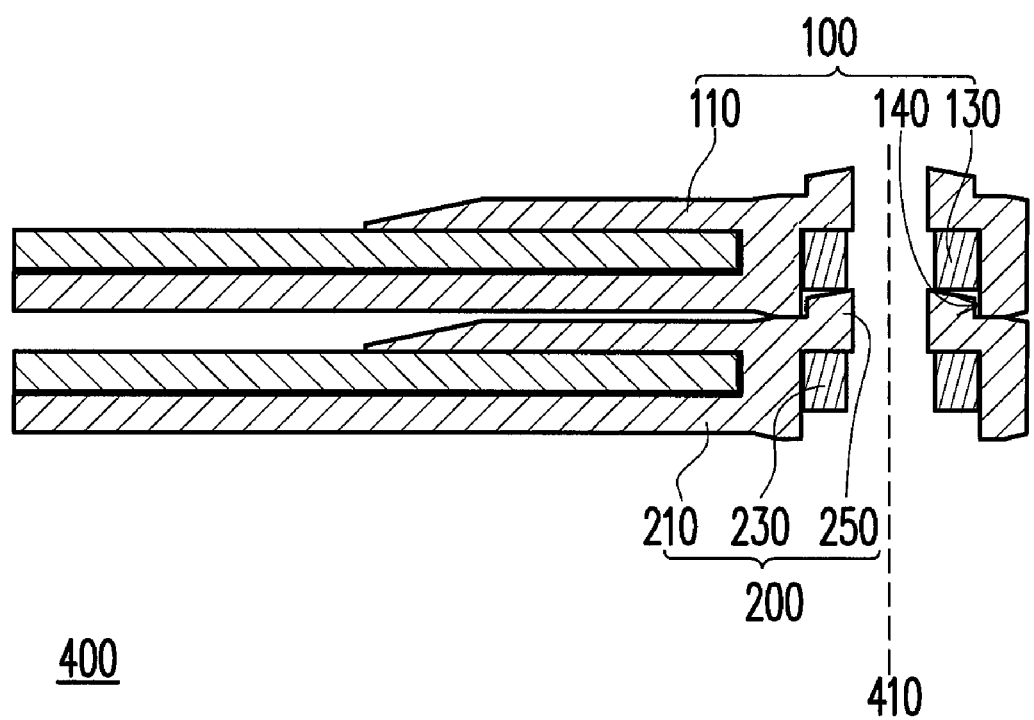
FIG. 4 is a cross-sectional view of a data storage device assembly according to an exemplary embodiment of the present invention.

FIG. 4 is a cross-sectional view of a data storage device assembly according to an exemplary embodiment of the present invention. Referring to FIG. 4, the data storage device assembly 400 includes a data storage device 100 and a data storage device 200. The magnetic element 130 of the data storage device 100 and the magnetic element 230 of the data storage device 200 may both be magnets or a magnet and a paramagnetic material that can be attracted by the magnet (such as iron or nickel). Accordingly, the data storage device 100 and the data storage device 200 can attract each other and accordingly be stacked together. The structure of the data storage device 200 is similar to or the same as that of the data storage device 100 therefore will not be described herein.

To be specific, because the sizes of the protruding parts of the data storage devices 100 and 200 substantially match the sizes of the first openings thereof, the protruding part 250 of the data storage device 200 is just fit the first opening 140 of the data storage device 100. Accordingly, the magnetic element 130 of the data storage device 100 can be attracted by the magnetic element 230 of the data storage device 200 and the body 110 of the data storage device 100 can be stacked on the body 210 of the data storage device 200.

Figure 5:
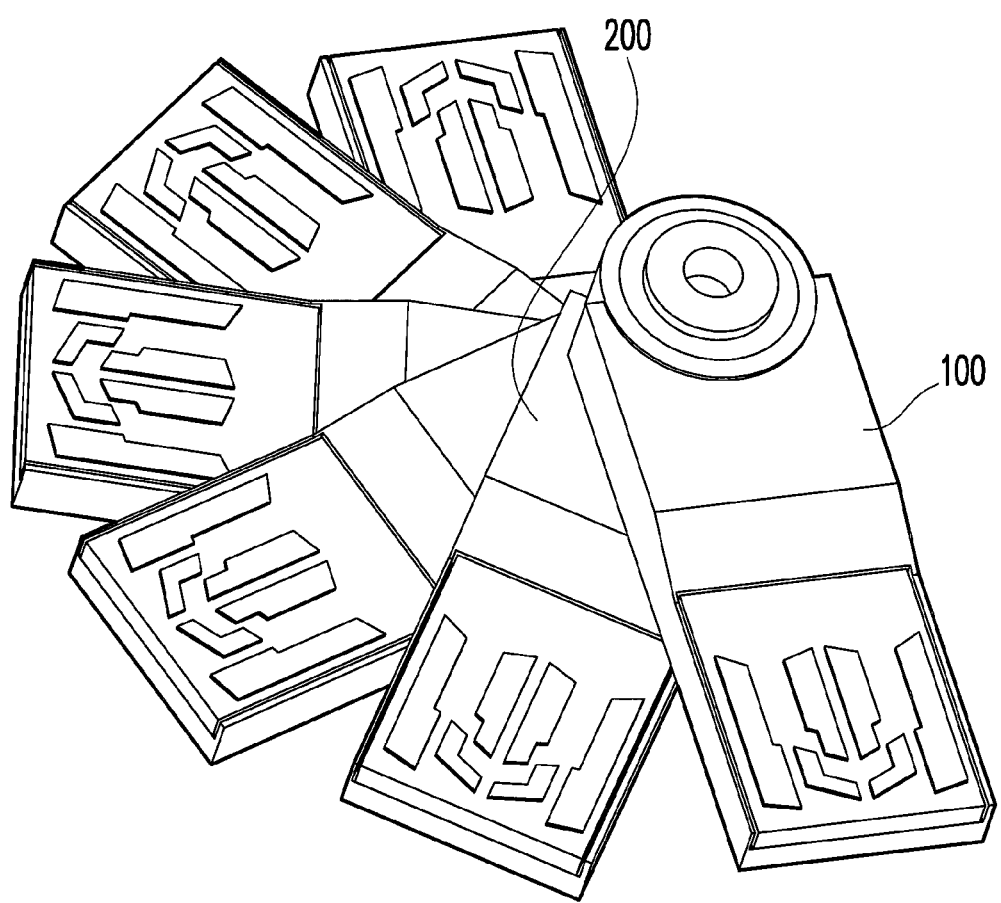
FIG. 5 is a diagram of a data storage device assembly according to an exemplary embodiment of the present invention.

In an exemplary embodiment, the protruding parts and first openings of the data storage devices 100 and 200 are all in a circular shape. The data storage device 200 is pivoted to the first opening 140 of the data storage device 100 through the protruding part 250. When the magnetic element 130 is attracted by the magnetic element 230 and the data storage device 100 and the data storage device 200 are stacked together, the data storage device 100 and the data storage device 200 can rotate along the axis 410 and relative to each other. FIG. 5 is a diagram illustrating the data storage devices 100 and 200 and several other data storage devices that are stacked together through magnetic force between the magnetic elements thereof and are rotated to show parts of their bodies. Such a design allows a user to check whether a desired data storage device is among the stacked data storage devices by rotating the data storage devices.

In addition, because the first opening on the body, the second opening of the protruding part, and the through hole on the magnetic element of each data storage device form a connected space which like a through hole, after several data storage devices are stacked together, a user can pass a cord, a chain, or a ring through aforementioned space so as to carry these data storage devices conveniently.

Conventionally, a buckle structure is usually adopted for stacking devices. But the buckle structure requires a higher cost and the devices to be stacked at a specific angle, and the buckle structure is easily worn off by time. However, in the exemplary embodiments described above, a magnetic element is disposed on each data storage device and different data storage devices are stacked together through magnetic force between the magnetic elements. In other words, a user can easily stack several data storage devices by simply moving the magnetic elements of the data storage devices close to each other as long as at least one of the magnetic elements disposed on the data storage devices is a magnet. The stacked data storage devices are convenient to be managed and are prevented from being lost.

In addition, because the magnetic force between the magnetic elements is not very strong, when the user needs to use any one of the stacked data storage devices, the user can easily obtain the desired data storage device without applying much force. Moreover, because the cost of the magnetic elements is low and the magnetic force thereof won't get lost, the magnetic elements do not wear off even if the user frequently stacks the data storage devices together or accesses some of the data storage devices. Thereby, the fabrication cost of the data storage devices is reduced and the possibility of operation failure is reduced.

Figure 6:
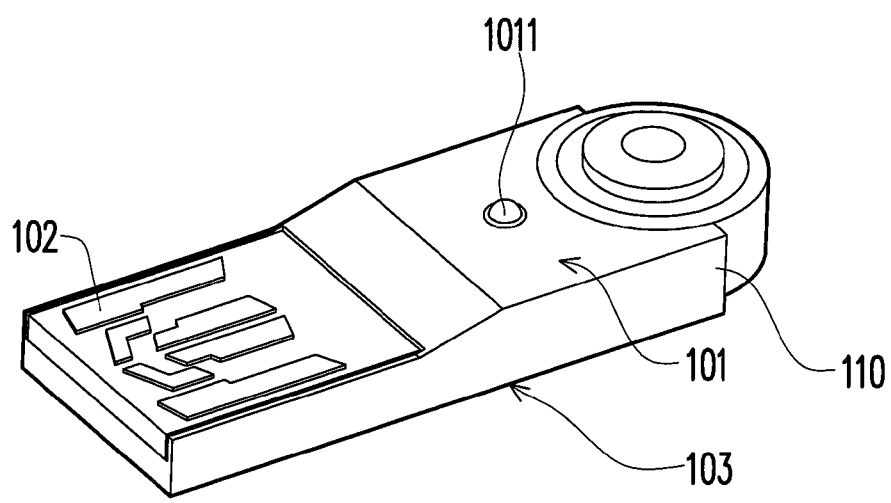
FIG. 6 is a diagram illustrating the appearance of a data storage device according to another exemplary embodiment of the present invention.
Figure 7:
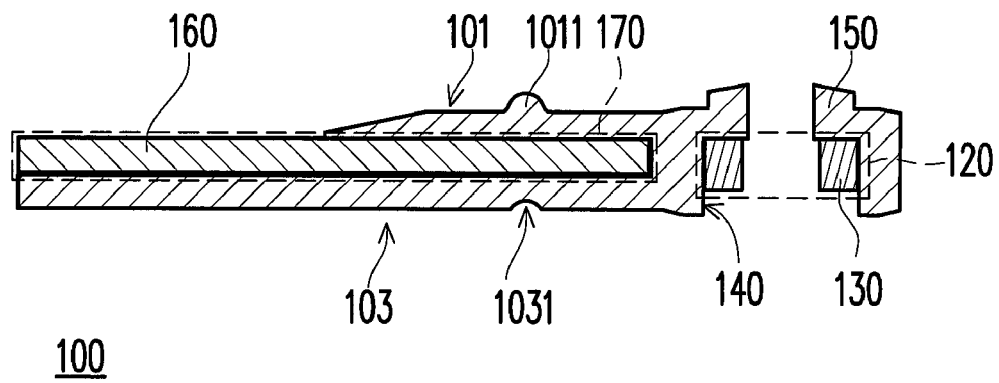
FIG. 7 is a cross-sectional view of a data storage device according to another exemplary embodiment of the present invention.

FIG. 6 and FIG. 7 are diagrams of a data storage device according to another exemplary embodiment of the present invention. Referring to both FIG. 6 and FIG. 7, in the present exemplary embodiment, a first fixing portion 1011 is further disposed on a first surface 101 of the body 110 of the data storage device 100, and a second fixing portion 1031 is further disposed on a second surface 103 opposite to the first surface 101. Herein the first fixing portion 1011 is a fixing protrusion, and the second fixing portion 1031 is a fixing groove.

Figure 8:
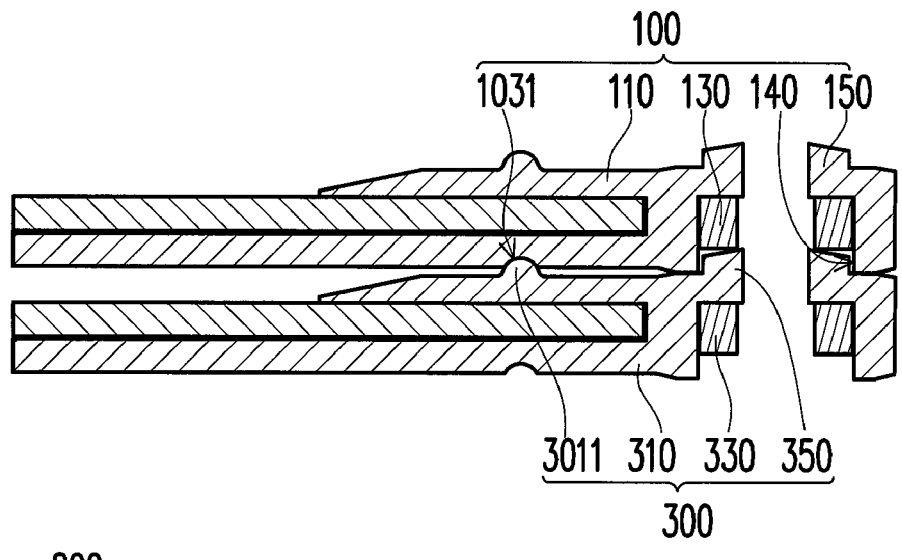
FIG. 8 is a cross-sectional view of a data storage device assembly according to another exemplary embodiment of the present invention.

FIG. 8 is a cross-sectional view of a data storage device assembly according to another exemplary embodiment of the present invention. Referring to FIG. 8, the data storage device assembly 800 includes a data storage device 100 and a data storage device 300. The magnetic element 130 of the data storage device 100 and the magnetic element 330 of the data storage device 300 may be both magnets or a magnet and a paramagnetic material attractable to the magnet, such as iron or nickel. The structure of the data storage device 300 is the same as or similar to that of the data storage device 100 therefore will not be described herein.

As shown in FIG. 8, the protruding part 350 of the data storage device 300 is just fit the first opening 140 of the data storage device 100, and the first fixing portion 3011 of the data storage device 300 is just fit the second fixing portion 1031 of the data storage device 100. The magnetic element 130 of the data storage device 100 and the magnetic element 330 of the data storage device 300 can attract each other so that the body 110 of the data storage device 100 can be stacked on the body 310 of the data storage device 300.

In the present exemplary embodiment, the first fixing portion (for example, a fixing protrusion) and the second fixing portion (for example, a fixing groove) on each data storage device offer a positioning effect when a large number of data storage devices are stacked together, so that a user can assemble the stacked data storage devices more conveniently. However, the present invention is not limited thereto, and in other exemplary embodiments, the first fixing portion and the second fixing portion may also be other positioning structures.

Figure 9:
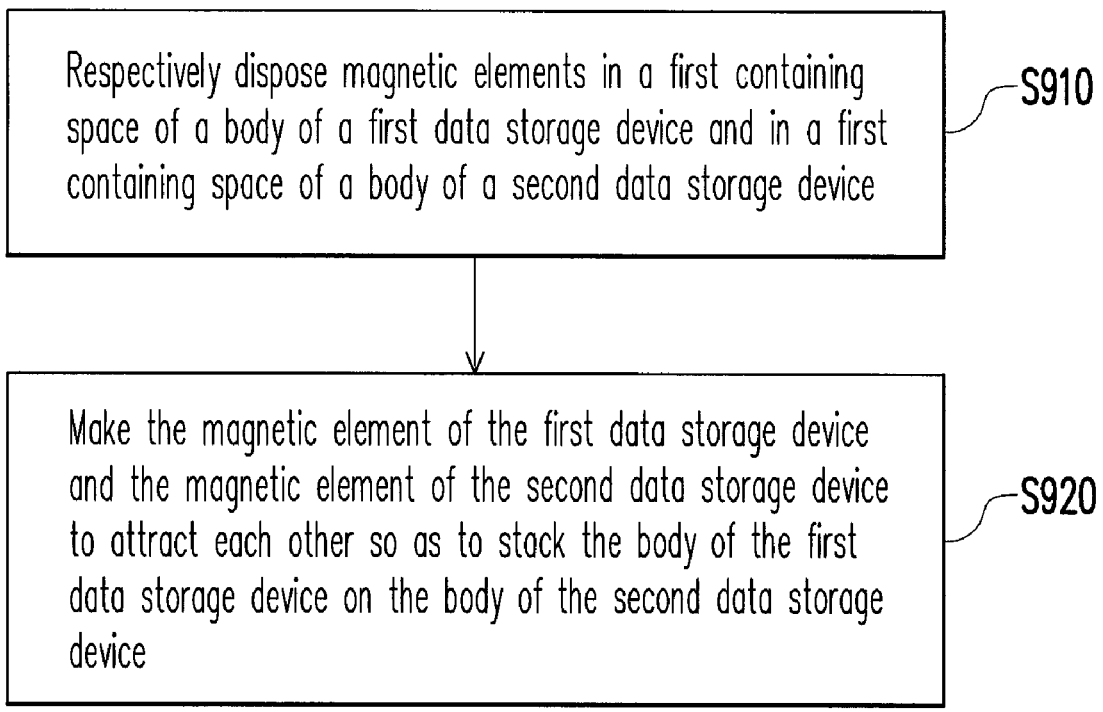
FIG. 9 is a flowchart of a data storage device stacking method according to another exemplary embodiment of the present invention.

FIG. 9 is a flowchart of a data storage device stacking method according to another exemplary embodiment of the present invention. In the present exemplary embodiment, a first data storage device and a second data storage device are stacked together to explain the technique provided by the present invention. Herein the structures of the first data storage device and the second data storage device are the same as or similar to that of the data storage device 100 in foregoing exemplary embodiments therefore will not be described herein.

Referring to FIG. 9, first, in step S910, magnetic elements are respectively disposed in the first containing space of the body of the first data storage device and in the first containing space of the body of the second data storage device. At least one of the magnetic element of the first data storage device and the magnetic element of the second data storage device is a magnet.

Then, in step S920, the magnetic element of the first data storage device and the magnetic element of the second data storage device are made to attract each other so as to stack the body of the first data storage device on the body of the second data storage device.

To be specific, the body of the first data storage device and the body of the second data storage device respectively have a first opening and a protruding part. Thus, by aligning the protruding part of the second data storage device with the first opening of the first data storage device and inserting the protruding part of the second data storage device into the first opening of the first data storage device, the magnetic element of the first data storage device and the magnetic element of the second data storage device attract each other and accordingly the body of the first data storage device is stacked on the body of the second data storage device.

In addition, the bodies of the first data storage device and the second data storage device respectively have a first surface and a second surface opposite to the first surface. When each first surface has a first fixing portion and each second surface has a second fixing portion, the first fixing portion of the second data storage device may be limited to the second fixing portion of the first data storage device, and the magnetic element of the first data storage device and the magnetic element of the second data storage device may be made to attract each other so as to stack the first data storage device and the second data storage device together.

In summary, the present invention provides a data storage device, a stacking method thereof, and a data storage device assembly, wherein a magnetic element is disposed on each data storage device, and a plurality of data storage devices are stacked together through the magnetic force between the magnetic elements. Thereby, a user can manage all his/her data storage devices conveniently and the data storage devices are prevented from being lost. Moreover, each of the data storage devices stacked together through magnetic force can be easily accessed. Furthermore, because the magnetic elements offer a low cost and do not wear off easily, the fabrication cost of the data storage devices is reduced and the possibility of operation failure is reduced. The advantages aforementioned not required in all versions of the present invention.

It will be apparent to those skilled in the art that various modifications and variations can be made to the structure of the present invention without departing from the scope or spirit of the present invention. In view of the foregoing, it is intended that the present invention cover modifications and variations of this invention provided they fall within the scope of the following claims and their equivalents.

What is claimed is:

1. A data storage device, comprising:
a body, having a first containing space and a second containing space;
a magnetic element, disposed in the first containing space; and
a storage device, disposed in the second containing space, wherein the storage device comprises:
an electrical connector terminal;
a memory chip; and
a memory controller, coupled to the electrical connector terminal and the memory chip, wherein the memory controller has no crystal oscillator.

2. The data storage device according to claim 1, wherein the body has a first opening and a protruding part, the first opening and the protruding part are respectively located at two opposite sides of the first containing space, and the first opening and the first containing space are connected with each other.

3. The data storage device according to claim 2, wherein a size of the protruding part substantially matches a size of the first opening.

4. The data storage device according to claim 2, wherein the protruding part has a second opening, the magnetic element has a through hole, and the first opening, the through hole, and the second opening are connected with each other.

5. The data storage device according to claim 2, wherein the protruding part and the first opening are both in a circular shape.

6. The data storage device according to claim 1, wherein the body has a first surface and a second surface opposite to the first surface, the first surface has a first fixing portion, and the second surface has a second fixing portion.

7. The data storage device according to claim 6, wherein the first fixing portion is a fixing protrusion, and the second fixing portion is a fixing groove.

8. The data storage device according to claim 1, wherein the magnetic element is a magnet, an iron material, a nickel material, or a paramagnetic material that is attracted by the magnet.

9. A data storage device assembly, comprising:
a first data storage device; and
a second data storage device,
wherein the first data storage device and the second data storage device respectively comprise:
a body, having a first containing space and a second containing space;
a magnetic element, disposed in the first containing space, wherein at least one of the magnetic element of the first data storage device and the magnetic element of the second data storage device is a magnet; and
a storage device, disposed in the second containing space, wherein the storage device comprises:
an electrical connector terminal;
a memory chip; and
a memory controller, coupled to the electrical connector terminal and the memory chip, wherein the memory controller has no crystal oscillator,
wherein the magnetic element of the first data storage device is attracted by the magnetic element of the second data storage device so that the body of the first data storage device is stacked on the body of the second data storage device.

10. The data storage device assembly according to claim 9, wherein each of the bodies has a first opening and a protruding part, the first opening and the protruding part are respectively located at two opposite sides of the first containing space, and the first opening and the first containing space are connected with each other.

11. The data storage device assembly according to claim 10, wherein a size of each of the protruding parts substantially matches a size of each of the first openings.

12. The data storage device assembly according to claim 10, wherein the protruding part of the second data storage device is just fit the first opening of the first data storage device.

13. The data storage device assembly according to claim 10, wherein the second data storage device is pivoted to the first opening of the first data storage device through the protruding part of the second data storage device.

14. The data storage device assembly according to claim 10, wherein each of the protruding parts has a second opening, each of the magnetic elements has a through hole, and the first opening, the through hole, and the second opening are connected with each other.

15. The data storage device assembly according to claim 10, wherein each of the protruding parts and each of the first openings are in a circular shape.

16. The data storage device assembly according to claim 9, wherein each of the bodies has a first surface and a second surface opposite to the first surface, wherein the first surface has a first fixing portion, and the second surface has a second fixing portion.

17. The data storage device assembly according to claim 16, wherein each of the first fixing portions is a fixing protrusion, each of the second fixing portions is a fixing groove, and the fixing protrusion of the second data storage device is just fit the fixing groove of the first data storage device.

18. A method, for stacking a first data storage device and a second data storage device, wherein the first data storage device and the second data storage device respectively include a body and a storage device, the body has a first containing space and a second containing space, and the storage device is disposed in the second containing space and the storage device comprises an electrical connector terminal, a memory chip, and a memory controller, wherein the memory controller is coupled to the electrical connector terminal and the memory chip and the memory controller has no crystal oscillator, the method comprising:

respectively disposing magnetic elements in the first containing space of the body of the first data storage device and in the first containing space of the body of the second data storage device, wherein at least one of the magnetic element of the first data storage device and the magnetic element of the second data storage device is a magnet; and making the magnetic element of the first data storage device and the magnetic element of the second data storage device to attract each other so as to stack the body of the first data storage device on the body of the second data storage device.

19. The method according to claim 18, wherein each of the bodies has a first opening and a protruding part, the first opening and the protruding part are respectively located at two opposite sides of the first containing space, and the first opening and the first containing space are connected with each other, wherein the step of making the magnetic element of the first data storage device and the magnetic element of the second data storage device to attract each other so as to stack the body of the first data storage device on the body of the second data storage device further comprises:

aligning the protruding part of the second data storage device with the first opening of the first data storage device; and inserting the protruding part of the second data storage device into the first opening of the first data storage device.

20. The method according to claim 18, wherein each of the bodies has a first surface and a second surface opposite to the first surface, the first surface has a first fixing portion, and the second surface has a second fixing portion, wherein the step of making the magnetic element of the first data storage device and the magnetic element of the second data storage device to attract each other so as to stack the body of the first data storage device on the body of the second data storage device further comprises:

limiting the first fixing portion of the second data storage device to the second fixing portion of the first data storage device.

* * * * *